United States Patent [19]

Barrett, Jr. et al.

[11] Patent Number: 5,483,687
[45] Date of Patent: Jan. 9, 1996

[54] OPERATIONAL TRANSCONDUCTANCE AMPLIFIER TRACK AND HOLD SYSTEM

[75] Inventors: Raymond L. Barrett, Jr., Ft. Lauderdale; Barry Herold, Boca Raton, both of Fla.; Jeannie H. Kosiec, Schaumburg, Ill.

[73] Assignee: Motorola, Inc., Schaumburg, Ill.

[21] Appl. No.: 149,592

[22] Filed: Nov. 10, 1993

[51] Int. Cl.$^6$ ..................................................... H04B 1/18
[52] U.S. Cl. ......................... 455/183.2; 455/265; 327/91
[58] Field of Search ............................ 455/38.3, 343, 455/265, 266, 180.3, 180.4, 183.2, 76, 38.3, 191.2; 328/151; 307/352, 353; 327/91

[56] References Cited

U.S. PATENT DOCUMENTS

| | | | |
|---|---|---|---|
| 3,869,681 | 3/1975 | Klein et al. | 331/96 |
| 4,651,034 | 3/1987 | Sato | 307/556 |
| 4,691,125 | 9/1987 | Rybicki | 307/353 |
| 4,783,602 | 11/1988 | Viswanathan | 307/353 |
| 4,893,094 | 1/1990 | Herold et al. | 331/1 A |
| 4,910,752 | 4/1990 | Yester, Jr. et al. | 375/75 |
| 4,923,328 | 2/1990 | Ichikawa | 455/183.2 |
| 5,128,629 | 7/1992 | Trinh | 330/129 |
| 5,130,670 | 7/1992 | Jaffe | 331/2 |
| 5,170,497 | 12/1992 | Uchikura | 455/183.2 |
| 5,175,729 | 12/1992 | Borras et al. | 455/76 |

Primary Examiner—Edward F. Urban
Attorney, Agent, or Firm—Gregg Rasor

[57] ABSTRACT

A voltage track and hold circuit operates to track a tuning voltage and holding the tuning voltage (404) as a reference voltage (408). In the track mode, the track and hold circuit includes a first operational transconductance amplifier (401) and a first charge storage device (402) coupled to a first input (403) of the first operational transconductance amplifier (401). The first charge storage device (402) accumulates a charge that corresponds with the tuning voltage (404). A second charge storage device (405) is coupled to a second input (406) and an output (407) of the first operational transconductance amplifier (401). The second charge storage device (405) accumulates a reference charge such that the reference voltage (408) present at the second charge storage device (405) is substantially equivalent to the tuning voltage (404).

10 Claims, 4 Drawing Sheets

OPERATIONAL TRANSCONDUCTANCE AMPLIFIER TRACK AND HOLD SYSTEM

FIELD OF THE INVENTION

This invention relates in general to a voltage track and hold system and more particularly to a voltage track and hold system that uses operational transconductance amplifiers to track a phase lock loop tuning voltage in a radio frequency communication device.

BACKGROUND OF THE INVENTION

In portable battery operated products such as a radio frequency communication device, it is desirable to have the lowest possible overall current drain in order to maximize battery life. Moreover, it is desirable to operate such products at the lowest possible voltage so as to minimize their total power consumption.

Conventional radio frequency communication devices may use one or more phase lock loops to synthesize frequencies needed for digital logic or radio frequency circuits. To conserve power, the synthesizers may be operated in a power saving mode where one or more of the phase lock loops are switched on during signal transmission or reception, and off during "sleep" periods. Operation in this fashion can substantially increase available battery life, thus resulting in more usable "talk time" in radio frequency communication devices such as cellular telephones or the like.

Power saving operation as discussed above is not without its problems. A major problem that confronts designers of power saving systems is that when switching a conventional phase locked frequency synthesizer from on to off, the tuning voltage developed inside the loop will decay. As a result of the decayed voltage, the frequency synthesizer's voltage controlled oscillator starts up at a frequency different from the desired operating frequency. Additionally, decay of the tuning voltage causes increased loop startup time and degraded frequency settling characteristics. Many artisans have attempted to solve the voltage decay problem using various techniques, one of the more successful of which is illustrated below.

A conventional microcomputer is used to implement a control program that controls an analog to digital converter for sampling the last operational tuning voltage developed inside the phase lock loop, then to apply a digital to analog converter voltage that is substantially equal to the last operational tuning voltage to the tuning element when re-activating the phase locked frequency synthesizer. This technique is generally successful in re-activating the phase locked frequency synthesizer at approximately the same output frequency. However, the complex circuits required in this approach may actually consume more power than is saved by operating the phase locked frequency synthesizer in a power saving mode. Consequently, prior attempts such as discussed above, have resulted in systems that more than eliminated any power saving and performance advantages gained through the use of sleep periods.

Thus, what is needed is voltage track and hold system that tracks a phase lock loop tuning voltage in a radio frequency communication device while operating in a power saving mode, the voltage track and hold system effectively conserving power while offering improved phase lock loop frequency switching, locking, and tracking characteristics.

SUMMARY OF THE INVENTION

Briefly, according to the invention, there is provided a voltage track and hold circuit for tracking a tuning voltage and holding the tuning voltage as a reference voltage. The track and hold circuit, when operating in a track mode comprises a first operational transconductance amplifier, a first charge storage device coupled to a first input of the first operational transconductance amplifier, the first charge storage device operating to accumulate a charge that corresponds with the tuning voltage, and a second charge storage device coupled to a second input and an output of the first operational transconductance amplifier, the second charge storage device operating to accumulate a reference charge such that the reference voltage present at the second charge storage device is substantially equivalent to the tuning voltage.

DESCRIPTION OF A PREFERRED EMBODIMENT

Figure 1:
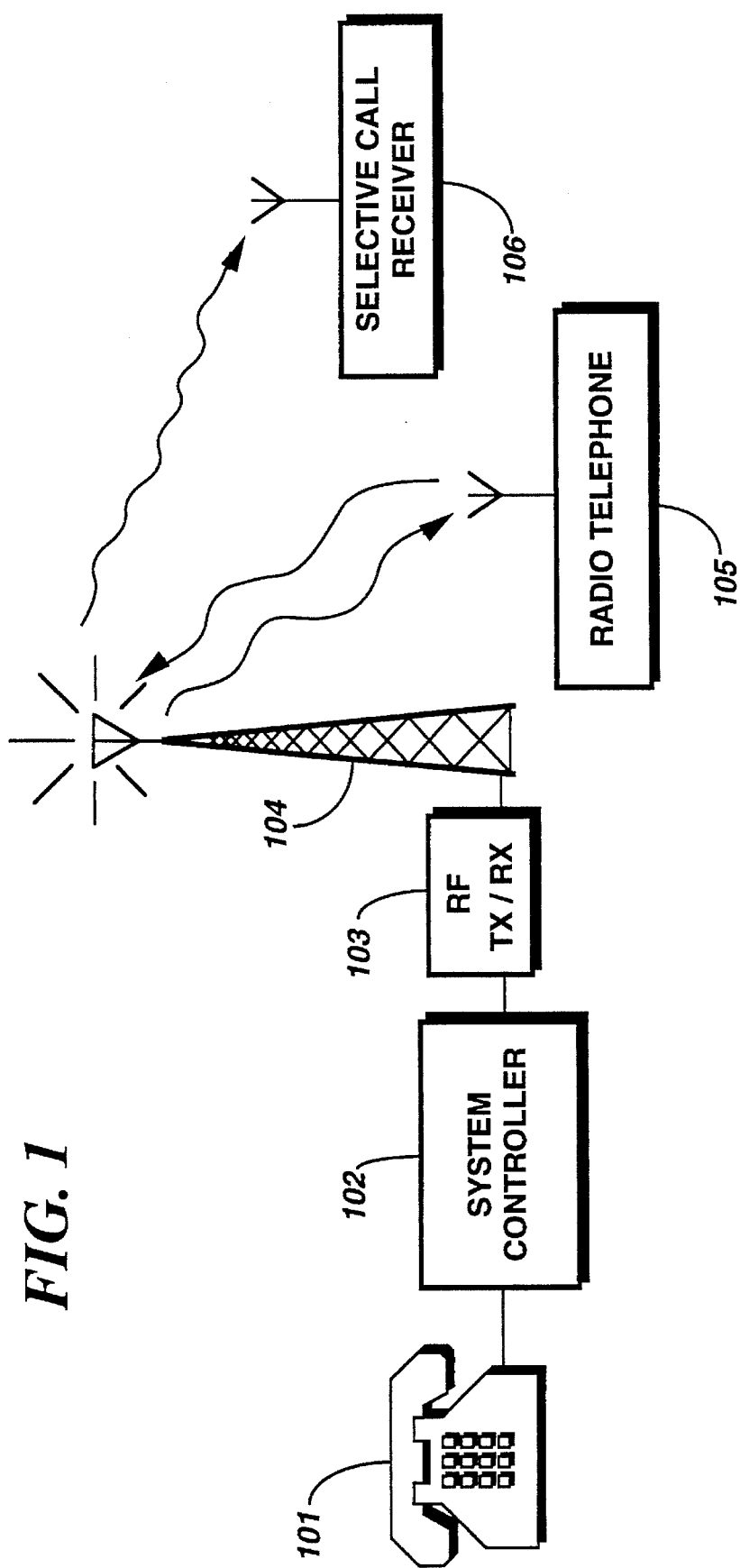
FIG. 1 is a block diagram of a radio frequency communication system suitable for use with the present invention.

Referring to FIG. 1, the preferred embodiment of a radio communication system comprises a telephone 101 connected by a conventional public switched telephone network (PSTN) to a system controller 102 which may oversee operation of the radio frequency transmitter/receiver 103 and encodes and decodes the inbound and outbound addresses into formats that are compatible the respective land line and cellular radio telephone addressing requirements. The system controller 102 can also function to encode paging messages for transmission by the radio frequency transmitter/receiver 103. Telephony signals are transmitted to and received from a radio telephone 105 by at least one antenna 104 coupled to the radio frequency transmitter/receiver 103. The radio frequency transmitter/receiver 103 may also be used to transmit paging messages to an optional selective call receiver 106.

It should be noted that the system controller 102 is capable of operating in a distributed transmission control environment that allows mixing cellular, simulcast, master/slave, or any conventional wide and local area coverage scheme. Moreover, as one of ordinary skill in the art would recognize, the telephonic and paging functions may reside in separate system controllers that may operate either independently or in a networked fashion.

Figure 2:
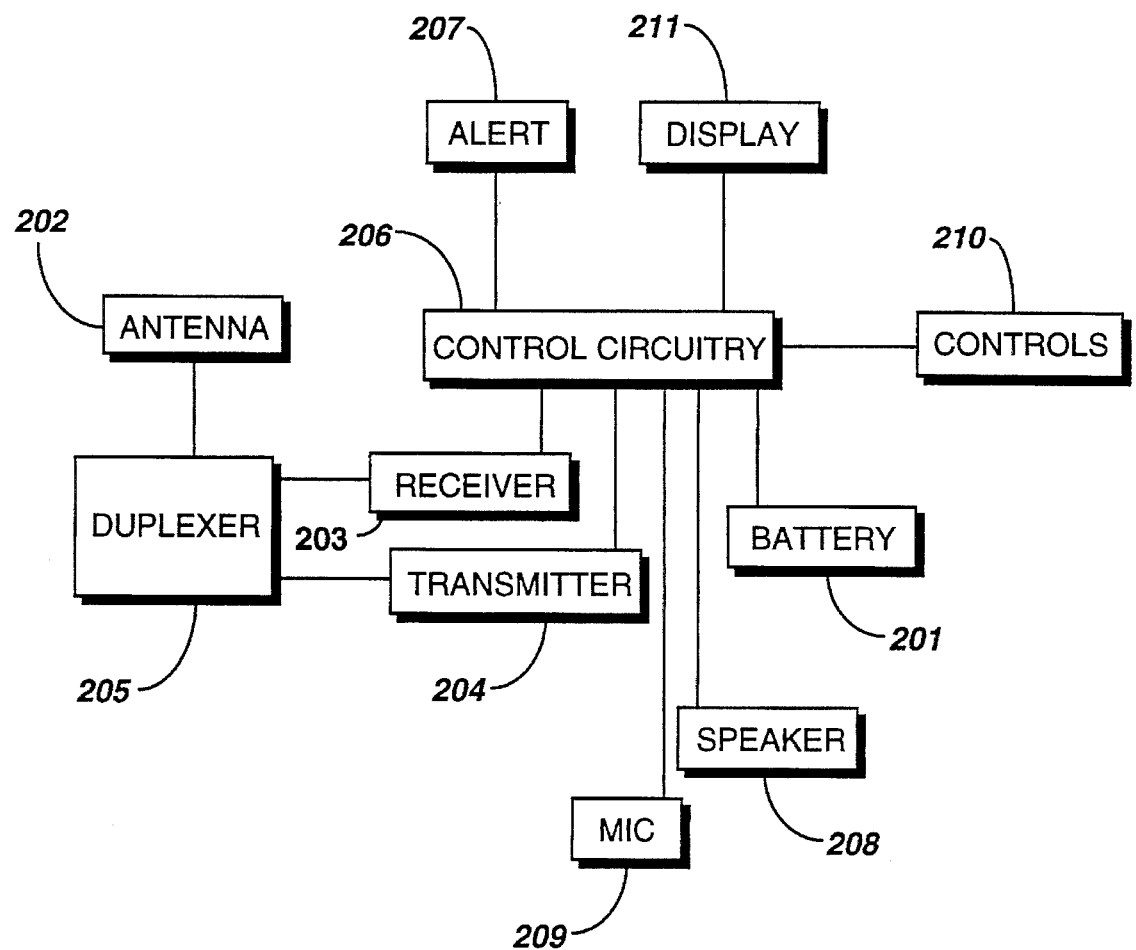
FIG. 2 is a block diagram of a radio telephone depicted in FIG. 1 system suitable for use with the present invention.

Referring to FIG. 2, a block diagram is shown of a battery 201 powered radio telephone. A radio frequency signal is received and/or transmitted by an antenna 202. The antenna is coupled to a receiver 203 and a transmitter 204 by a duplexer 205. The received signal is coupled from the receiver 203 to the control circuitry 206 for recovering any information contained within the received signal. This recovered information is then used to activate an alert 207 (a ringer in the case of a cellular radio telephone), and after answering the call, to sustain a telephone connection. When the telephone connection is completed, the user may audibly communicate with another party via a speaker 208 and a microphone 209. The control circuitry 206 routes recovered audio to the speaker 208 which converts electrical energy into acoustical energy thus enabling the user to hear any communications. The microphone 209 is used to convert acoustic energy into electrical energy for use by the control circuitry 206 in modulating the radio frequency carrier produced by the transmitter 204.

The user may initiate a call by selecting the proper control 210 and entering a number of a party to be contacted. When entering and sending, the number may be presented on a display 211 to provide the user with visual feedback confirming the number entered and subsequently sent.

Figure 3:
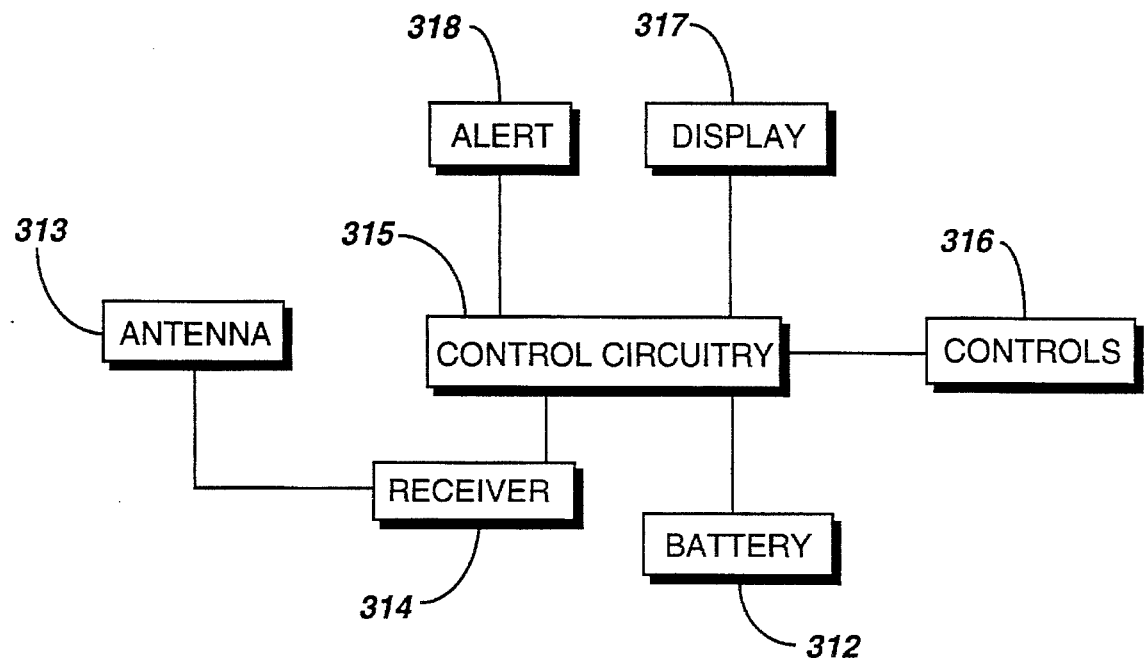
FIG. 3 is a block diagram of a selective call receiver depicted in FIG. 1 system suitable for use with the present invention.

Referring to FIG. 3, a block diagram is shown of a battery 312 powered selective call receiver. The selective call receiver operates to receive a signal via an antenna 313. The received signal is routed from the antenna 313 to the receiver 314. The receiver 314 operates to demodulate the received signal using conventional techniques and forwards a demodulated signal to the control circuitry 315, which decodes and recovers information contained within the received signal. In accordance with the recovered information and user controls 316, the selective call receiver may present at least a portion of the information, such as by a display 317, and may signal the user via a sensible alert 318 that a message has been received.

In the preferred embodiments of both the radio telephone and the selective call receiver, the associated control circuitry 206, 315 may comprises a microprocessor or application specific integrated circuit that implements functions such as a signal processor (e.g., a decoder), a conventional signal multiplexer, a voltage regulator that may supply a regulated voltage to other portions of the radio. Alternatively, the associated control circuitry 206, 315 may include features such as A/D, D/A converters, programmable I/O ports, a control buss, environmental sensing circuitry such as for light or temperature conditions, audio power amplifier circuitry, control interface circuitry, a clock or local oscillator frequency synthesizer, and display illumination circuitry. These elements are typically conventionally assembled to provide the marketable features comprising the radio telephone or selective call receiver requested by a customer.

Figure 4:
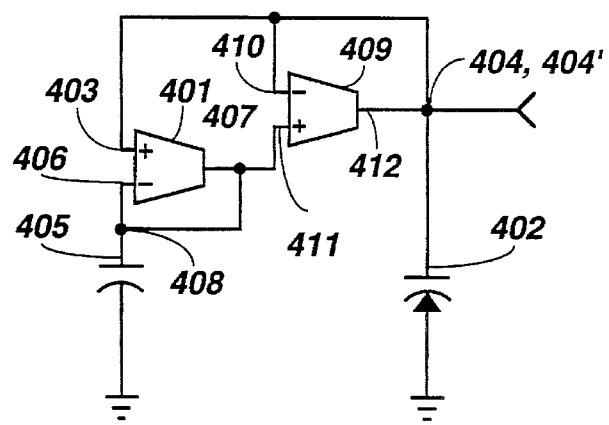
FIG. 4 is a schematic diagram of an operational transconductance amplifier track and hold circuit in accordance with the preferred embodiment of the present invention.

Referring to FIG. 4, a schematic diagram illustrates an operational transconductance amplifier track and hold circuit in accordance with the preferred embodiment of the present invention. In the track mode, the operational transconductance amplifier track and hold circuit operates using a first operational transconductance amplifier 401, a first charge storage device 402 coupled to a first input 403 of the first operational transconductance amplifier 401, the first charge storage device 402 functioning to accumulate a charge that corresponds with a tuning voltage 404. A second charge storage device 405 is coupled to a second input 406 and an output 407 of the first operational transconductance amplifier 401, the second charge storage device 405 operating to accumulate a reference charge such that a reference voltage 408 present at the second charge storage device 405 is substantially equivalent to the tuning voltage 404.

When the radio communication device enters a sleep mode, the operational transconductance amplifier track and hold circuit enters a hold mode in which the first operational transconductance amplifier 401 is disabled and a second operational transconductance amplifier 409 is enabled. The second operational transconductance amplifier 409 has a first input 410 coupled to the first charge storage device 402 and a second input 411 coupled to the second charge storage device 405. The second operational transconductance amplifier 409 operates to minimize a voltage difference between the reference voltage 408 present at the second charge storage device 405 and a dormant tuning voltage 404' present at the first charge storage device 402 by supplying a charging current from an output of the second operational transconductance amplifier 409 to the first charge storage device 402 such that the dormant tuning voltage 404' remains substantially the same as the reference voltage 408. The dormant tuning voltage 404' is labeled as such because the circuitry associated with the first charge storage device 402 is in a dormant or stand-by state, that is, no operating bias is applied. In a conventional frequency synthesizer and phase lock loop system, the dormant tuning voltage would exponentially approach a ground potential because of energy losses within the real components implementing the system.

In modern battery-operated electronic circuitry, the energy stored in the battery is conserved during periods of inactivity by disabling circuitry unused during any particular mode of operation. The powered-down battery-energy-conservation modes of operation are counterbalanced in a tradeoff with the energy consumed to restore operation following a period of powered-down inactivity. The memory of circuit operation states prior to the entry power-down mode can be preserved to hasten the recovery following the return to an active mode.

A particular example of such a circuit memory state is the control voltage supplied to a voltage-controlled-oscillator (VCO) in a phase-lock-loop (PLL) used for frequency synthesis in a communication receiver. A substantial proportion of the instances in which the VCO in the PLL is required to enter a reduced power state and then return to normal operation, the VCO is required to return to the same frequency as prior to the inactive state, but because other portions of the system may also be in an inactive state, the feedback signals used to maintain the frequency of the VCO in the PLL are missing due to that same inactivity. Energy losses and leakages act to alter the state of the control voltage to the VCO during inactivity and a return to active mode operation requires a sufficient time for the re-activated feedback mechanisms to reduce the error in control voltage to an acceptable level. The required error reduction time reduces the efficiency gains obtained by introducing the inactivity mode, and consumes additional power to correct the errors.

The inclusion of a track-and-hold capability to the control voltage of the cited VCO example, however, can alter the rate at which error is introduced to the control voltage and consequently reduce the time and energy required return to the required frequency of operation. To exhibit this desired behavior the track-and-hold circuit must be constructed to consume very small amounts of power itself, since it remains active during the period that the PLL operation is otherwise inactive, and it must be constructed so that it minimizes errors accumulated or otherwise introduced by its inclusion. To meet these requirements in the cited example, the realization must provide a time-constant during the hold operation that is very much larger than the equivalent time-constant due to the leakage mechanisms, hence minimizing the accumulation of error due to time-dependent variation of the control voltage.

The operational transconductance amplifier output used to charge the holding capacitor must have a very high impedance, any inputs connected the holding capacitor must have a high impedance, and the capacitor itself must be of low leakage to provide a long time constant (e.g., retain the charge over a long period of time). To be as power conservative as possible, the holding circuitry must employ as small a holding capacitor as possible to minimize the power consumption during the tracking operation. To a lesser extent, the same considerations apply to the operational transconductance amplifier used to maintain the control voltage. However, the control voltage has the primary purpose of determining the VCO frequency and must be interconnected to the VCO, a loop filter, and indirectly a phase detector which impose limits on the characteristics of the control voltage node which constrain the choice of control voltage capacitor. To meet these constraints, the operational transconductance amplifier maintaining the voltage requires a generally higher current output capability, and to minimize error voltage it requires a higher transconductance, but does not require such a high output impedance.

The preceding example illustrates a typical application of the present invention in a track-and-hold circuit for PLL state variable maintenance during power-down mode. As a logical extension of this application, one of ordinary skill in the art can appreciate that the instant invention may have many other uses in the implementation of alternative state variable applications.

Figure 5:
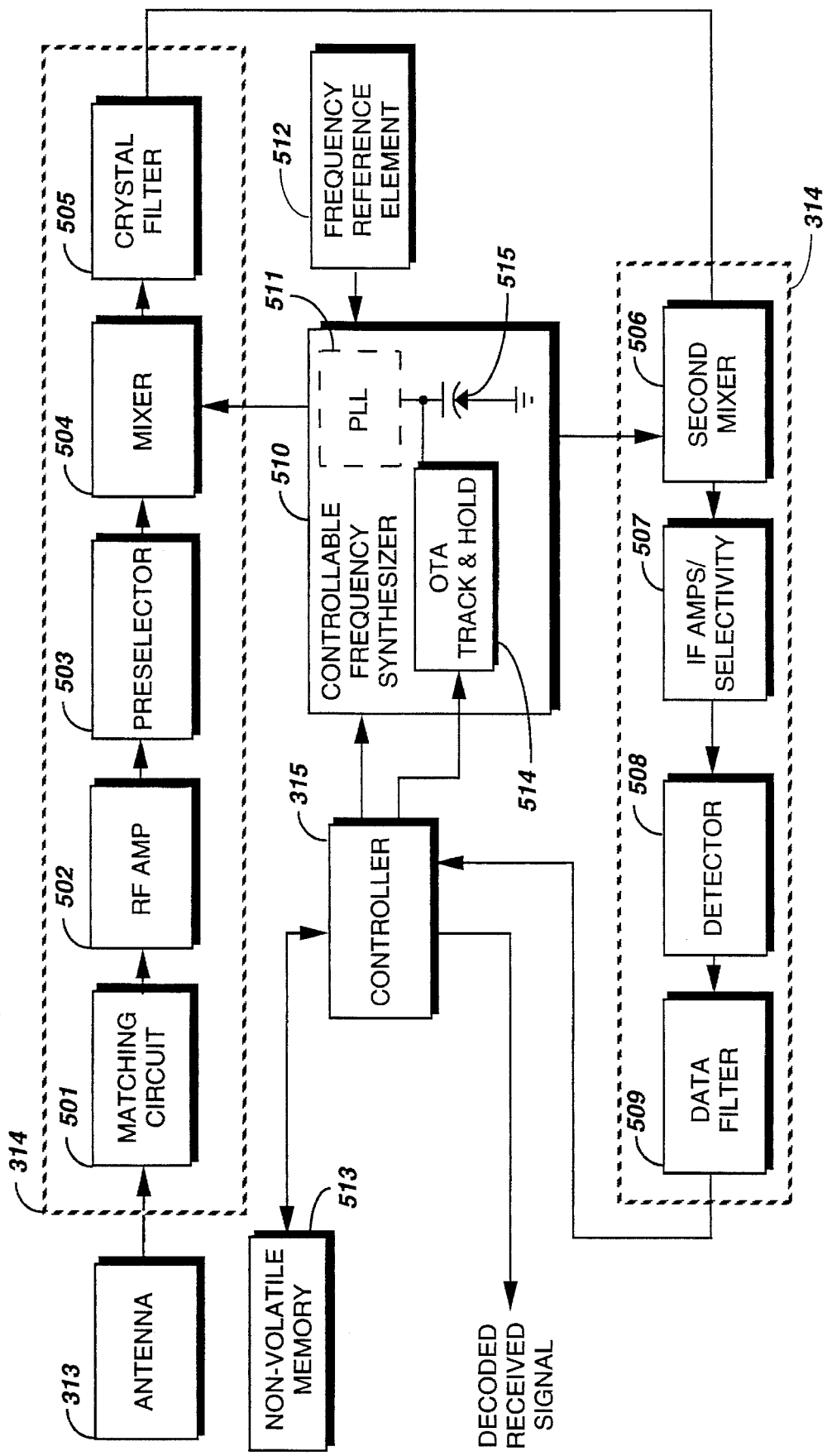
FIG. 5 is a block diagram of the selective call receiver depicted in FIG. 3 implementing an exemplary frequency synthesized dual conversion receiver that incorporates the operational transconductance amplifier track and hold circuit illustrated in FIG. 4 in accordance with the preferred embodiment of the present invention.

Referring to FIG. 5, a block diagram illustrates the selective call receiver depicted in FIG. 3 implementing an exemplary frequency synthesized dual conversion receiver that incorporates the operational transconductance amplifier track and hold circuit illustrated in FIG. 4 in accordance with the preferred embodiment of the present invention.

The selective call receiver "RF front end" 501, 502, 503, 504, 505 is responsive to a transmitted signal that is received and coupled in via an antenna 313, as is commonly known in the art. The received signal from the antenna 313 may be optionally preconditioned using known techniques to provide an optimum signal level within a predetermined frequency bandwidth that is coupled to a first mixer 504.

The optional preconditioning of the received signal is usually performed by a matching circuit 501, a radio frequency amplifier 502, and a preselector filtering circuit 503, the design and function of these circuits being generally well known in the art. The matching circuit 501 matches the antenna 313 impedance characteristics to the RF amplifier 502. Preferably, the matching circuit is designed to provide the RF amplifier 502 with an optimum noise match (minimum noise figure) and low insertion loss, thereby optimally delivering the received signal power from the antenna 313 to the RF amplifier 502. The amplified signal is then be coupled to a preselector filtering circuit 503 that accepts a desired signal with minimal attenuation (e.g., within a predetermined frequency band) and attenuates (i.e., rejects) all undesired signals. Consequently, the received signal is preconditioned and coupled to the first signal mixer 504.

The first mixer 504 subsequently mixes the preconditioned received signal with a first local oscillator injection signal provided by the controllable frequency synthesizer 510. The controllable frequency synthesizer has an output frequency derived from the frequency reference element 512. The resulting conversion generates a first intermediate frequency signal that is subsequently coupled to a crystal filter 505 that passes the first intermediate frequency signal and attenuates any undesired signals such as the first mixer image signal and the first local oscillator injection signal.

A second mixer 506 mixes the first intermediate frequency signal with a second local oscillator injection signal provided by the controllable frequency synthesizer 510. The resulting second intermediate frequency signal is typically filtered and amplified (i.e., by an intermediate frequency amplifying and filtering circuit 507) and coupled to a demodulator. The demodulator in this embodiment comprises a modulation detector 508 that recovers information (i.e., FSK digital data, audio tones, PSK digital data, SSB, etc.) that is coupled to a decoder (the control circuitry 315) via a data filter 509 in a manner well known in the art.

In performing frequency selection, an output of the control circuitry 315 is coupled to the controllable frequency synthesizer 510 to facilitate the programming of a phase lock loop 511. The control circuitry 315 effects changes in an output frequency of the controllable frequency synthesizer 510 via execution of a microcode program that produces a frequency control signal. The frequency control signal programs the output frequency of the controllable frequency synthesizer 510 using conventional techniques such as selecting a division ratio in a single or dual modulus divider, or possibly a fractional-N divider topology. The resulting output frequency reflects a frequency error of substantially zero parts per million with respect to a desired operating frequency (e.g., the local oscillator frequency, clock frequency, or the like).

The non-volatile ram (e.g., read only memory, backed-up random access memory, EEPROM, or the like) 513 may provide storage for executable controller instructions, storage for a table representing programmed output frequencies and their corresponding control word(s) (e.g., divide factors), and storage for non-volatile configuration information that may be necessary to perform the decisions and actions in the control process.

When the controllable frequency synthesizer 510 accepts a frequency control word, the dividers associated with the phase lock loop 511 are programmed, resulting in a change of bias across a current or voltage reactive tuning element such as a varactor diode 515. As the phase lock loop 511 output frequency stabilizes at the desired operating frequency, the current and voltage present at the varactor diode 515 an its associated tuning network is tracked by the operational transconductance amplifier track and hold circuit 514 that was detailed in reference to FIG. 4. When the control circuitry 315, under command of the microcode program, invokes a battery saving or "sleep" mode, the operational transconductance amplifier track and hold circuit 514 is switched into the "hold" mode by the control circuitry 315. Preferably, when entering the sleep mode, the control circuitry 315 further powers down the RF amp 502, first mixer 504, second mixer 506, the intermediate frequency amplifying and filtering circuits 507, the modulation detector 508, the data filter 509, and the phase lock loop 511, which consumes most of the power used by the controllable frequency synthesizer 510. In this fashion, the battery life of the portable radio communication device may be appreciably extended, since the circuitry need only be activated periodically to allow reception of address information for receiving a call.

Concerning re-activation, when the control circuitry 315, under command of the microcode program powers up the circuitry detailed above, the operational transconductance amplifier track and hold circuit 514 is switched back into a track mode. Since the operational transconductance amplifier track and hold circuit 514 was left operational during the sleep period, the tuning bias across the current or voltage reactive tuning element (e.g., the varactor diode 515) is substantially equivalent to the voltage previously present before the sleep mode was entered. Consequently, the phase lock loop 511 will restart almost instantaneously, requiring far less warm-up time as compared to prior art communication devices that use synthesized frequency sources. Operation in this manner not only improves the start-up performance, but it further conserves energy by shortening the time required to obtain an accurate, phase locked output frequency.

What is claimed is:

1. A voltage track and hold circuit for tracking a tuning voltage and holding the tuning voltage as a reference voltage, the track and hold circuit comprising:

in a track mode:

a first operational transconductance amplifier;

a first charge storage device coupled to a first input of the first operational transconductance amplifier, the first charge storage device operating to accumulate a charge that corresponds with the tuning voltage;

a second charge storage device coupled to a second input and an output of the first operational transconductance amplifier, the second charge storage device operating to accumulate a reference charge such that the reference voltage present at the second charge storage device is substantially equivalent to the tuning voltage; and in a hold mode:

a second operational transconductance amplifier having a first input coupled to the first charge storage device and a second input coupled to the second charge storage device, the second operational transconductance amplifier operating to minimize a voltage difference between the reference voltage present at the second charge storage device and a dormant tuning voltage present at the first charge storage device by supplying a charging current from an output of the second operational transconductance amplifier to the first charge storage device such that the dormant tuning voltage remains substantially equivalent to the reference voltage.

2. The voltage track and hold circuit according to claim 1 wherein the first operational transconductance amplifier has an output impedance at least as great as an output impedance of the second operational transconductance amplifier.

3. The voltage track and hold circuit according to claim 1 wherein the first charge storage device is a low leakage capacitor for holding the reference voltage.

4. The voltage track and hold circuit according to claim 1 wherein the second charge storage device comprises:

a capacitance associated with a varactor diode frequency tuning network.

5. The voltage track and hold circuit according to claim 4 wherein the varactor diode frequency tuning network is part of a phase lock loop included in a phase locked frequency synthesizer for a radio frequency communication device.

6. A radio frequency communication device, comprising:

a control circuit for managing information communication by the radio frequency communication device; and a controllable frequency synthesizer coupled to the control circuit and including at least one phase lock loop having a programmable output signal responsive to a tuning voltage generated in response to a control signal coupled from the control circuit for selecting a frequency of the programmable output signal that is usable by at least one of a receiver and a transmitter, the controllable frequency synthesizer further comprising:

a track and hold circuit that tracks the tuning voltage and holds a reference voltage, the track and hold circuit comprising:

in a track mode:

a first operational transconductance amplifier;

a first charge storage device coupled to a first input of the first operational transconductance amplifier, the first charge storage device operating to accumulate a charge that corresponds with the tuning voltage;

a second charge storage device coupled to a second input and an output of the first operational transconductance amplifier, the second charge storage device operating to accumulate a reference charge such that the reference voltage present at the second charge storage device is substantially equivalent to the tuning voltage; and in a hold mode:

a second operational transconductance amplifier having a first input coupled to the first charge storage device and a second input coupled to the second charge storage device, the second operational transconductance amplifier operating to minimize a voltage difference between the reference voltage present at the second charge storage device and a dormant tuning voltage present at the first charge storage device by supplying a charging current from an output of the second operational transconductance amplifier to the first charge storage device such that the dormant tuning voltage remains substantially equivalent to the reference voltage.

7. The radio frequency communication device according to claim 6 wherein the first operational transconductance amplifier has an output impedance at least as great as an output impedance of the second operational transconductance amplifier.

8. The radio frequency communication device according to claim 6 wherein the first charge storage device is a low leakage capacitor for holding the reference voltage.

9. The radio frequency communication device according to claim 6 wherein the second charge storage device comprises:

a capacitance associated with a varactor diode frequency tuning network.

10. The radio frequency communication device according to claim 9 wherein the varactor diode frequency tuning network is part of a phase lock loop included in a phase locked frequency synthesizer for a radio frequency communication device.

* * * * *